(12) United States Patent
Soni et al.

(10) Patent No.: US 8,397,199 B2
(45) Date of Patent: Mar. 12, 2013

(54) VERSATILE METHOD AND TOOL FOR SIMULATION OF AGED TRANSISTORS

(75) Inventors: Apurva H. Soni, Milpitas, CA (US);
Antonietta Oliva, San Jose, CA (US);
Edgardo F. Klass, Palo Alto, CA (US);
Matthew J. T. Page, San Jose, CA (US);
James E. Burnette, II, San Jose, CA (US)

(73) Assignee: Apple Inc., Cupertino, CA (US)

( * ) Notice: Subject to any disclaimer, the term of this patent is extended or adjusted under 35 U.S.C. 154(b) by 387 days.

(21) Appl. No.: 12/762,861

(22) Filed: Apr. 19, 2010

(65) Prior Publication Data

US 2011/0257954 A1 Oct. 20, 2011

(51) Int. Cl.
*G06F 17/50* (2006.01)
(52) U.S. Cl. .......... 716/132; 716/55; 716/126; 703/14
(58) Field of Classification Search .............. 716/55, 716/126, 132
See application file for complete search history.

(56) References Cited

U.S. PATENT DOCUMENTS

| | | | |
|---|---|---|---|
| 6,766,274 | B2 | 7/2004 | Puthucode |
| 7,340,360 | B1 | 3/2008 | Zhang et al. |
| 8,099,269 | B2 * | 1/2012 | Topaloglu et al. ............. 703/14 |
| 2009/0094569 | A1 | 4/2009 | Kuchii |
| 2010/0088660 | A1 | 4/2010 | Kim et al. |
| 2010/0114543 | A1 | 5/2010 | Namba et al. |

OTHER PUBLICATIONS pp. 1-2 entitled "Background of the Invention" from the specification of the captioned U.S. Appl. No. 12/762,861.
Keith Green, "Simulation of Circuit Reliability with RelXpert," Texas Instruments and Cadence, Sep. 22, 2005, 19 pages.
RelXpert, "The Solution for Circuit-Level, Hot-Carrier / NBTI Simulation," Celestry Design Technologies, 8 pages. Downloaded from Internet on Feb. 5, 2010.
Cadence, "Reliability Simulation in Integrated Circuit Design," White Paper, 2003, 11 pages.
U.S. Appl. No. 13/177,916, filed Jul. 7, 2011.
Liu et al.; "Design Tools for Reliability Analysis"; Jul. 24, 2006; ACM; pp. 1-6.
Srinivasan et al.; "Lifetime Reliability: Toward an Architectural Solution"; 2005; IEEE; pp. 1-11.
Notice of Allowance issued on Aug. 3, 2012 in U.S. Appl. No. 13/177,916, pp. 1-8.

* cited by examiner

*Primary Examiner* — Thuan Do
(74) *Attorney, Agent, or Firm* — Lawrence J. Merkel; Meyertons, Hood, Kivlin, Kowert & Goetzel, P.C.

(57) ABSTRACT

In an embodiment, an aging analysis tool may be configured to identify transistors that are expected to experience aging effects according to worst case stress vectors and/or designer identified worst case conditions. The aging analysis tool may modify a representation of the circuit (e.g. a netlist), replacing the identified transistors with aged transistors (e.g. by modifying parameters of the transistors in the netlist). The aging analysis tool may process the modified netlist over a range of conditions at which the circuit is expected to operate, to ensure that the design meets specifications after aging. The process may be repeated until the aged design meets specifications (with circuit modifications made by the designer to improve the design).

20 Claims, 6 Drawing Sheets

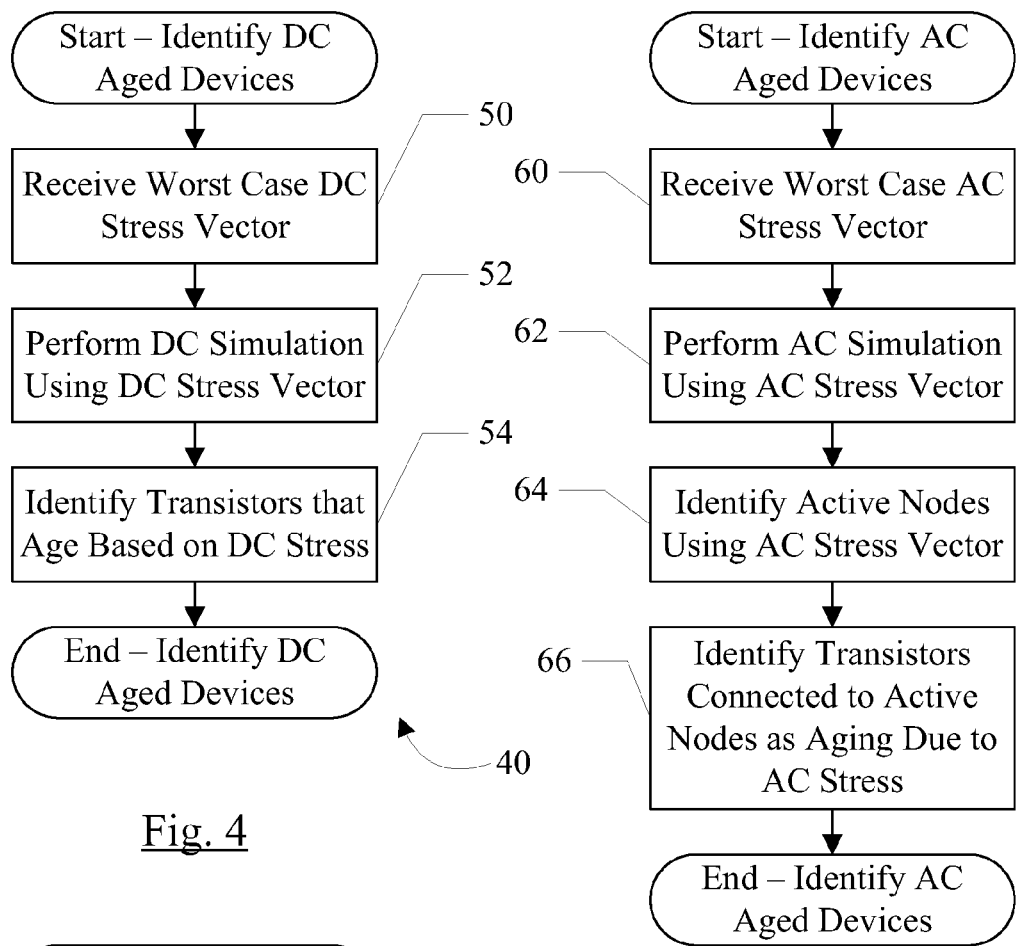
Fig. 4
Fig. 5
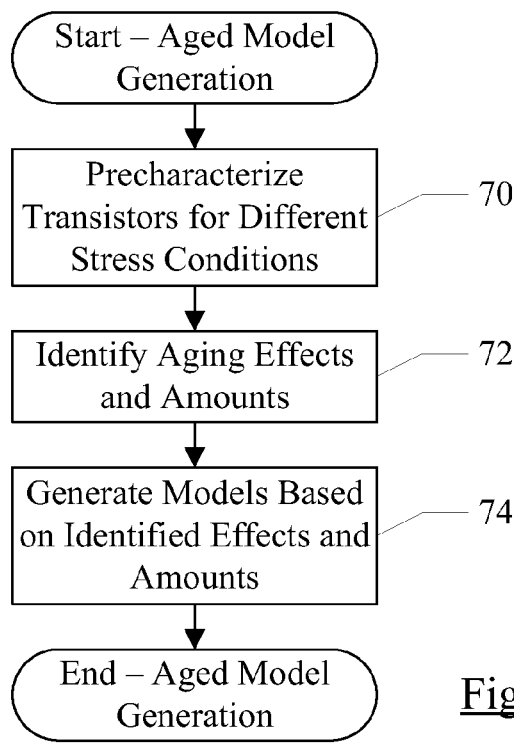
Fig. 6

Computer Accessible Storage Medium 200

Aging Anaylsis Tool
202

Fig. 9

VERSATILE METHOD AND TOOL FOR SIMULATION OF AGED TRANSISTORS

BACKGROUND

1. Field of the Invention

This application is related to the field of integrated circuit design methodology and tools, and more particularly to transistor level simulation.

2. Description of the Related Art

One design specification that must be met in many integrated circuit designs is a lifetime requirement. That is, a typical instance of the integrated circuit must be able to operate for at least a certain designated period of time. A factor that influences the lifetime of the integrated circuits is the aging of transistors that are included in the integrated circuits.

Over time, transistors in the integrated circuit can experience various aging effects such as Hot Carrier Injection (HCI), Bias Temperature Instability (BTI), etc. BTI can include negative BTI (NBTI) for P-type metal-oxide-semiconductor (PMOS) transistors and positive BTI (PBTI) for and n-type MOS (NMOS) transistors. The aging effects change the operation of the transistors, typically reducing their performance. For example, the magnitude of the saturation current in the transistor can decrease, the threshold voltage required to activate the transistor can increase, etc. Accordingly, the operational characteristics of the circuit (e.g. its timing or power consumption) can change over time. Eventually, these changes result in the integrated circuit becoming non-functional or subject to erroneous operation.

One mechanism for increasing the lifetime of the integrated circuit is to simulate the aging effects that can be experienced in the integrated circuit, and to design the circuitry to continue to function properly in the presence of aged transistors. That is, the circuit can be designed to tolerate up to a certain amount of aging effects while still remaining within specification for the circuit, so that the integrated circuit still functions properly.

Various commercially-available software tools can be used to model aging effects. Typically, these tools use transistor models provided by the foundries that manufacture integrated circuits. The foundries typically provide models for one type of simulator (e.g. the Spectre Simulator, from Cadence Design Systems, Inc. (San Jose, Calif.)) and have not validated models for other simulators such as SPICE-based simulators. Accordingly, the models provided by the foundries are expressed using syntax defined by the simulator selected by the foundry. Some simulators also have a limitation on the size of the circuit design that they can simulate, which in turn limits the size of the circuit to which the aging tools can be applied. For example, large cache and/or memory arrays often cannot be processed by such tools. A design house that wishes to simulate large models and/or use a different model (e.g. from a different foundry) is prevented from doing so.

SUMMARY

In an embodiment, an aging analysis tool may be configured to simulate a model of a circuit for one or more stress vectors. The stress vectors may include conditions that place the circuit under various aging stresses. For example, one or more stress vectors may specify constant input stimulus to the circuit (e.g. constant input voltages). Such stress vectors may be referred to herein as DC stress vectors. A simulation using a DC stimulus may be referred to as a DC simulation. In some embodiments, one or more stress vectors may specify varying input stimulus to the circuit, referred to as AC stress vectors herein. A simulation that uses an AC stimulus may be referred to herein as an AC simulation. The aging analysis tool may process the results of simulating the stress vectors on the circuit, and may identify transistors that may be subject to aging effects. Transistors that are to be aged due to the DC stress may be referred to as DC-aged. Similarly, transistors that are to be aged due to AC stress may be referred to as AC-aged.

Alternatively or in addition to stress vectors, the aging analysis tool may receive a list of nets which are identified by the circuit designer as exhibiting a high frequency of switching. Devices to be AC-aged may be identified as those devices connected to the listed nets. Similarly, the aging analysis tool may receive a list of nets that are at a constant state for long periods of time. The aging analysis tool may identify transistors that are turned on when the identified nets are in a constant state as transistors that are to be DC-aged. In one particular embodiment, DC stress vector simulation to identify DC-aged transistors may be used in conjunction with a list of nets that experience high degrees of switching to identify AC-aged transistors.

The aging analysis tool may modify a netlist that describes the circuit, replacing the identified transistors with aged transistors. For example, in an embodiment, the netlist may include various transistor parameters that may be modified to reflect the effects of aging, and replacing the transistors with aged transistors may be performed by modifying the parameters. The aging analysis tool may simulate the modified netlist, or a second model derived from the modified netlist, over a range of conditions at which the circuit is expected to operate, to ensure that the design meets specifications after aging. The process may be repeated (with circuit modifications made by the designer to improve the design) until the aged design meets specifications.

In an embodiment, the aging analysis tool may be used with a variety of simulators. A simulator may be selected, and the aging analysis tool may invoke the selected simulator to perform the simulation. Accordingly, in an embodiment, any simulator that is capable of simulating the circuit may be used. Furthermore, different simulators may be used at different times, or the aging analysis tool may be used with different simulators that are used by different designers. That is, the aging analysis tool may be agnostic to the simulator used to simulate models of the design. The aging analysis tool may be flexible and thus may be used in a variety of designs.

BRIEF DESCRIPTION OF THE DRAWINGS

The following detailed description makes reference to the accompanying drawings, which are now briefly described.

FIG. 4 is a flowchart illustrating one embodiment of a direct current (DC) analysis block shown in FIG. 3.

FIG. 5 is a flowchart illustrating one embodiment of an alternating current (AC) analysis block shown in FIG. 3.

FIG. 6 is a flowchart illustrating one embodiment of generating aged device models for transistors.

FIG. 9 is a block diagram of one embodiment of a computer accessible storage medium.

Figure 1:
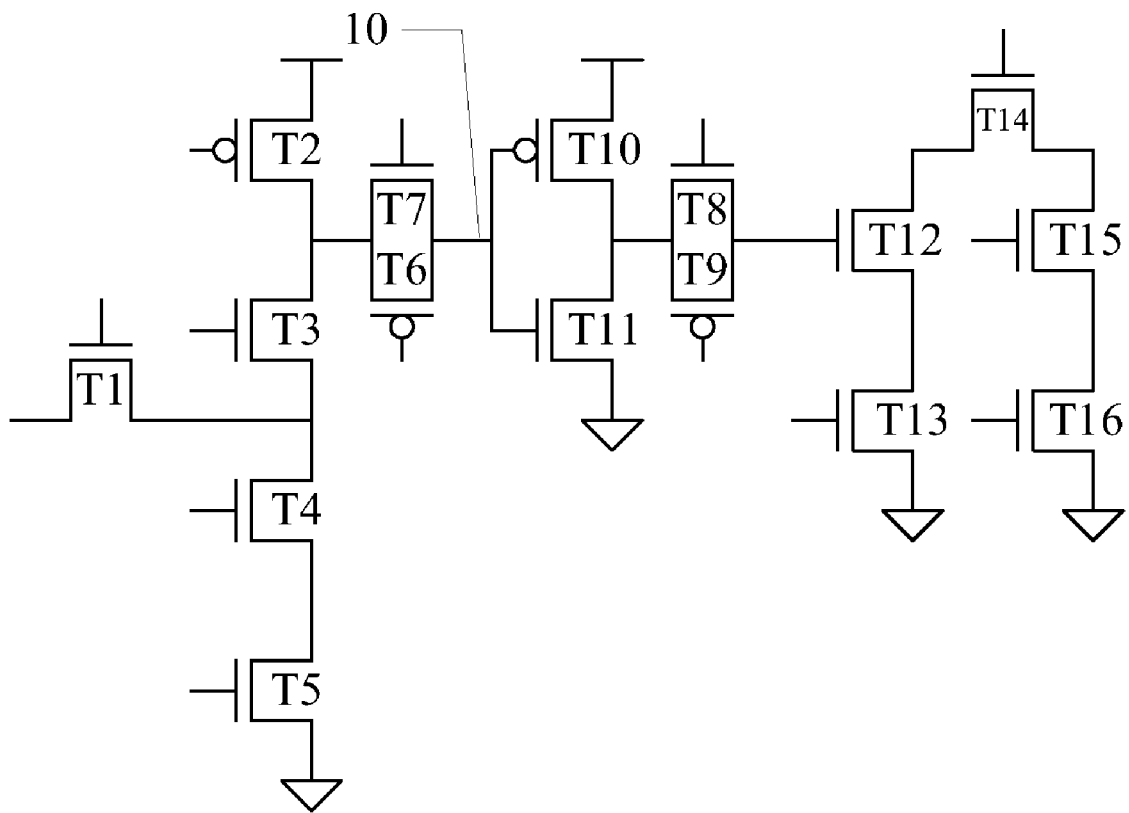
FIG. 1 is a block diagram of one embodiment of a circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

The acronym DC stands for direct-current and the acronym AC stands for alternating current. In the context of this disclosure, DC stimulus refers to a stimulus in which the inputs to the circuit are driven in a constant state (e.g. a DC voltage). There may or may not be current flowing in the circuit under DC stimulus conditions. For example, in a static logic circuit, there is no active current flow under DC stimulus conditions once the logic circuit has switched. Nevertheless, the stimulus is referred to as a DC stimulus and the simulation using the stimulus is referred to as a DC simulation. Similarly, an AC stimulus refers to inputs that are varying during simulation and the corresponding simulation is referred to as an AC simulation.

FIG. 1 is a circuit diagram illustrating an exemplary circuit. The circuit may include various transistors, such as the transistors T1-T16. Additional transistors may be included as desired. Additional circuit elements may also be included, e.g. capacitors (which are sometimes implemented via transistors also), resistors, etc. FIG. 1 is merely an example circuit shown to illustrate how the aging analysis tool may be used to identify transistors susceptible to aging effects and to model the aging effects to ensure the design meets requirements as the transistors age.

In a given circuit, some transistors may be more susceptible to aging than others. In one case, a transistor that is turned on (e.g. a magnitude of the gate to source or gate to drain voltage of the transistor exceeds a magnitude of a threshold voltage of the transistor) for long periods of time in normal operation may be more susceptible to DC aging effects than other transistors. For example, if the node 10 in FIG. 1 is typically at ground (or $V_{SS}$) in operation, the transistor T10 may be more susceptible to DC aging since it is in the on state. On the other hand, if the node 10 is typically at $V_{DD}$ in operation, the transistor T11 may experience DC aging. More generally, a transistor may experience varying levels of DC aging if its gate-to-source voltage is sufficient to turn the transistor on under DC input conditions. A transistor that is frequently turned on and off during operation may experience AC aging. More particularly, a transistor that is connected to a node that frequently switches during operation may be susceptible to AC aging. For example, if node 10 frequently switches under AC input conditions, the transistors T10 and T11 may be susceptible to AC aging. DC aging effects may be predominately represented by NBTI, while AC aging effects may include both NBTI and HCI. In some cases, PBTI effects may also be included, and thus more generally BTI effects may be represented in the aging effects.

The transistors T1-T16 may be P-type metal-oxide-semiconductor (PMOS) transistors or N-type MOS (NMOS) transistors. The PMOS transistors are illustrated with the circle on the gate terminal, and the NMOS transistors do not include the circle (i.e. standard symbols for PMOS and NMOS transistors, respectively). Other embodiments may include other MOS transistors, other field effect transistors, and/or other transistor types (e.g. bipolar junction transistors (BJTs)).

The circuit as shown in FIG. 1 may be modeled for simulation purposes. For example, in Spice-like simulators, the transistors may be listed in a "Spice deck", which is a file that describes the electrical elements in a circuit and the nodes to which the elements are connected. The nodes may be numbers, with node 0 represent ground and other nodes having non-zero numbers. Each electrical element may be identified by element type, may be given an element name, may optionally be given one or more element values, and may be listed in the Spice deck along with a list of two more nodes to which the device is connected. Transistors may be elements in the Spice deck. In some embodiments, the transistor model name may invoke a user-defined transistor model that has various properties that can be assigned element values. Other embodiments may include internal (to the simulator) transistor models with specifiable values and/or may include both internal and user-defined models. While Spice-like simulators are used as an example (including various "fast-Spice" simulators), other embodiments may implement any transistor-level simulator (e.g. the Spectre simulator mentioned above). Additionally, a netlist description of the circuit may be provided. A netlist may include a list of devices (e.g. transistors), which may in some cases include parameters. The netlist may further include a list of net names (which may describe nodes in the circuit, or arbitrary amounts and shapes of interconnect between terminals of the devices in the netlist). Accordingly, applying the net names to the terminals of the devices describes the interconnect between the devices.

The transistor model may describe the behavior of the transistor responsive to the voltages and currents to which the transistor's terminals are exposed. Various models may implement linear and/or non-linear approximations of the transistor behavior. The specifiable element values for the transistor may control the approximations (e.g. the values may include saturation current, threshold voltage, etc.). Additionally, the specifiable values may include one or more aging characteristics in some models. The netlist representation of the transistors may similarly include various specifiable values or parameters, which may specify aging characteristics for the devices. The aging characteristics may specify modifications in the transistor behavior, approximating the aging effects that real transistors may experience. In other cases, modifying the "standard" characteristics of the transistor (e.g. shifting the threshold voltage, reducing the saturation current) may be used to produce aged transistors. An aged transistor model may either be a different model that describes the behavior of the transistor using different linear and/or non-linear approximations than the non-aged transistor model, or may be the same model with different element values for one or more parameters of the model (e.g. aging characteristics or other characteristics such as threshold voltage or saturation current). The non-aged transistor/transistor model may be referred to herein as a "nominal" transistor/transistor model. The nominal transistor/transistor model may describe the operation of the transistor without aging effects. A nominal transistor may also be referred to as a new transistor, or a "fresh" transistor. Aged transistors may also be referred to as "degraded" transistors.

As mentioned above, circuit simulations may include DC simulations and/or AC simulations. Generally, a DC simulation may be a simulation in which supply voltages and forcing functions in the circuit model have fixed values. The DC simulation may resolve to a node voltage for each node and a current between nodes that are connected by one or more elements. The result of the simulation may thus be a list of voltages and currents. An AC simulation may include variable forcing functions, and the result of the simulation may be node voltages and/or currents in the circuit as a function of time. The AC simulation may include switching activity on various nodes in the circuit, which may be measured and the rate of switching activity on the nodes may be characterized.

Figure 2:
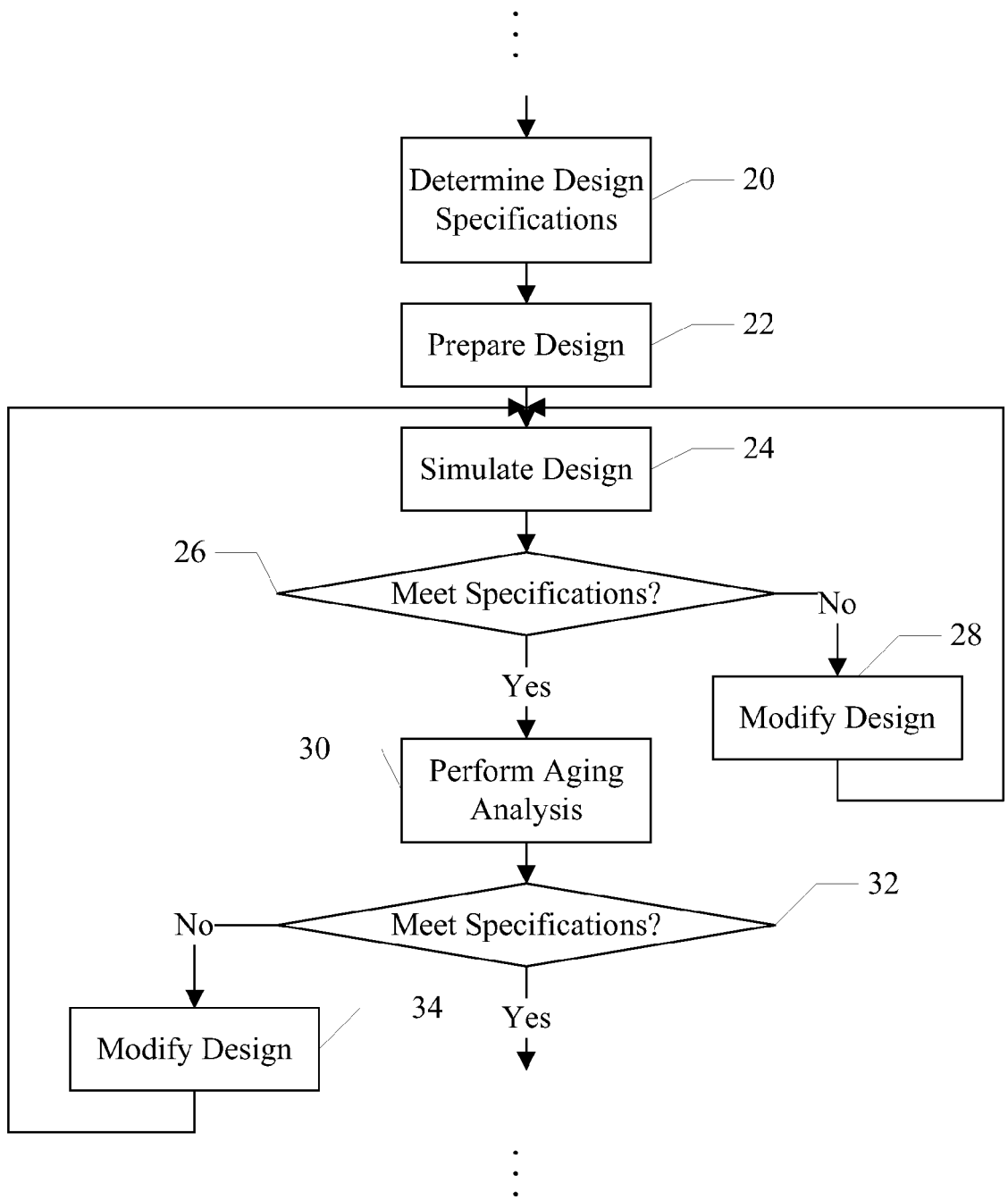
FIG. 2 is a flowchart illustrating a portion of one embodiment of a design flow.

Turning now to FIG. 2, a flowchart is shown illustrating a portion of a design flow for an integrated circuit at a high level. While the blocks are shown in a particular order for ease of understanding, other orders may be used. Additionally, various design activities may proceed in parallel and somewhat independently (e.g. timing analysis of the design and layout of the circuitry), although there may be information exchanged back and forth between activities as the design is refined. Various software tools may be used to perform a portion or all of the flowchart illustrated in FIG. 2. Where tools are used, the tools may include instructions which, when executed, implement the operation described for the tools. Generally, any of the software described herein may be executed on one or more computers to perform the desired operation.

The designer may determine the specifications for the circuit design (block 20). The specifications may be provided directly by a customer to which the integrated circuit including the circuit is to be sold, or may be determined based on the requirements of other circuitry (internal or external to the integrated circuit) that the circuit will interface to. The specifications may include size requirements, power consumption requirements, timing requirements, etc.

The designer may prepare the circuit design (block 22). Preparing the design may include creating a schematic of the circuit, sizing the various transistors (e.g. channel length/width), selecting among available transistor devices (e.g. there may be transistors with different nominal threshold voltages and/or oxide thicknesses), etc. Preparing the design may also include creating one or more models for various simulators (e.g. transistor level simulators such as Spice, functional simulators, static timing analysis tools, etc.). Preparing the design may also include generating a netlist describing the circuit in terms of transistors and nets connected between the transistor terminals. In some cases, models may be automatically generated using software tools based on the schematic, the netlist, or other design descriptions.

The designer may simulate the model(s) (block 24), and may review the results of the simulations to determine if the design meets specifications (decision block 26). If not (decision block 26, "no" leg), the designer may modify the design (block 28). The modifications may refine the design, bringing the design closer to meeting the specifications. The simulation and analysis may be repeated as the design is refined (blocks 26 and 28). In this embodiment, the simulation referred to in block 24 may simulate the circuit using nominal transistor models.

The designer may also perform aging analysis on design (block 30). The results of the aging analysis may be reviewed to determine if the circuit meets specifications as it ages (decision block 32). If not (decision block 32, "no" leg), the designer may modify the design (block 34), refining the design based on the aging analysis results. The refined design may be simulated (block 24) and analysis of the design and its ability to meet specifications may be performed. The process of simulating and refining the design may be repeated until the design meets specifications.

While the aging analysis blocks 30, 32, and 34 are shown separately and occurring after the other simulations and analyses (blocks 24, 26, and 28), the illustrating is merely for clarity and identifying the aging analysis component of the overall flow. Various simulations and analyses may generally be performed as desired, in any order and/or in parallel, as the design of the circuit is refined.

Figure 3:
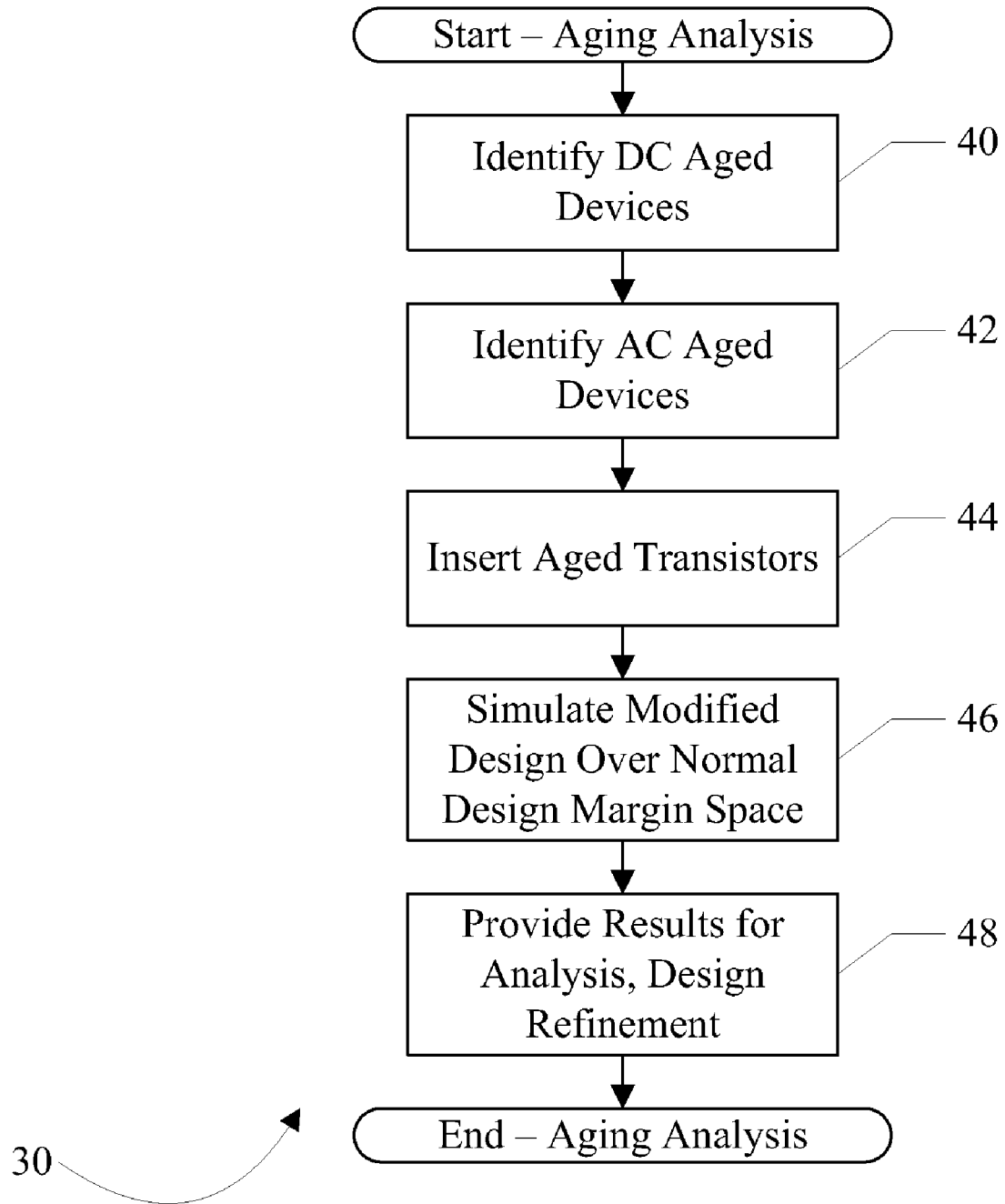
FIG. 3 is a flowchart illustrating one embodiment of an aging analysis block shown in FIG. 2.

Turning now to FIG. 3, a flowchart illustrating one embodiment of aging analysis (block 30 from FIG. 2) is shown. While the blocks are shown in a particular order for ease of understanding, other orders may be used. Blocks may be implemented in software (e.g. an aging analysis tool, in combination with a transistor level simulator, in one embodiment). The software may include instructions which, when executed, implement the described operations.

The aging analysis tool may be configured to identify transistors that may experience DC aging (block 40), and transistors that may experience AC aging (block 42). The aging analysis tool may insert aged transistors into a representation of the circuit (block 44). For example, the aged transistors may be inserted into a netlist representation of the circuit. More particularly, parameters of the transistors instantiated in the netlist may be modified to cause aging effects in the transistors, in one embodiment. The parameters may include, e.g., threshold voltage and saturation current. Such parameter modification may be referred to as insertion of aged transistors. Alternatively, aged transistor models may replace nominal transistor models in the simulation model for the circuit, creating a second model that includes aging effects on the transistors identified as aging due to DC or AC stresses. The aging effects for DC versus AC stresses may different, and thus the modifications to the aged transistors may vary based on the type of aging. As mentioned previously, inserting aged devices may include changing the parameters of the transistor models in the circuit model, or replacing the models with different models, in various embodiments. In either case, a second model/netlist may be generated to preserve the original (non-aged) model/netlist, if desired. Furthermore, the second model may be generated from the second (modified) netlist.

The aging analysis tool may simulate the modified design over the normal design margin space (block 46). For example, the aging analysis tool may invoke the transistor simulator using the second model. The nominal design margins for the circuit may include, e.g., variations in supply voltage, temperature, etc. according to the specifications for the circuit. The results of these simulations on the aged model may be provided for analysis and design refinement (e.g. blocks 32 and 34 in FIG. 3).

FIG. 4 is a flowchart illustrating one embodiment of identifying DC aged devices (block 40 from FIG. 3). While the blocks are shown in a particular order for ease of understanding, other orders may be used. Blocks may be implemented in software (e.g. the aging analysis tool, in combination with a transistor level simulator, in one embodiment). The software may include instructions which, when executed, implement the described operations.

The aging analysis tool may receive a worst-case DC stress vector (block 50). In one embodiment, the worst-case stress vector may be provided by the circuit designer, based on the conditions actually expected to be experienced in the circuit. The worst-case vector may be the vector that places the most DC stress on the circuit design (e.g. in terms of aging the transistors). There may be more than one vector provided, e.g. if there is more than one condition that may be stressful to transistors in the circuit. The aging analysis tool may invoke the transistor level simulator, and perform a DC simulation using the DC stress vector as an input (block 52). The aging analysis tool may examine the DC simulation results and identify transistors that may be aged due to DC stresses (block 54).

FIG. 5 is a flowchart illustrating one embodiment of identifying AC aged devices (block 42 from FIG. 3). While the blocks are shown in a particular order for ease of understanding, other orders may be used. Blocks may be implemented in software (e.g. the aging analysis tool, in combination with a transistor level simulator, in one embodiment) The software may include instructions which, when executed, implement the described operations.

The aging analysis tool may receive a worst-case AC stress vector (block 60). In one embodiment, the worst-case stress vector may be provided by the circuit designer, based on the AC conditions actually expected to be experienced in the circuit. The worst-case vector may be the vector that places the most AC stress on the circuit design (e.g. in terms of aging the transistors). That is, the AC stress vector may include the most switching activity, turning transistors on and off the most frequently, etc. There may be more than one vector provided, e.g. if there is more than one condition that may be stressful to transistors in the circuit. The aging analysis tool may invoke the transistor level simulator, and perform a AC simulation using the AC stress vector as an input (block 62). The aging analysis tool may examine the AC simulation results and identify nodes which are the most active in the simulation (e.g. the nodes that experience the most on/off activity) (block 64). The transistors that are connected to the identified nodes may be transistors that are aged due to AC stresses (block 66).

In one embodiment, the transistors that are identified as AC aged or DC aged may be replaced by transistors that experience worst case aging. In another embodiment, the aging analysis tool may estimate the amount of aging that is expected for a given transistor based on the DC/AC conditions that actually exist on that transistor in the simulations performed by the aging analysis tool. An appropriate amount of aging effect may then be implemented on a transistor-by-transistor basis.

In other embodiments, rather than receiving a stress vector or vectors, the aging analysis tool may receive a list of nets (node names) that have the highest levels of stress (AC or DC). The aging analysis tool may process the list and identify aged transistors as those transistors that are connected to the listed nodes. More particularly, in one embodiment, DC aging may be determined from one or more worst-case DC stress vectors and AC aging may be determined from a designer-provided list of nets that are expected to switch frequently (and analyzing the netlist to identify transistors connected to the listed nets).

Turning next to FIG. 6, a flowchart is shown illustrating one embodiment of generating aged transistor models to use for aging analysis. While the blocks are shown in a particular order for ease of understanding, other orders may be used. Blocks may be implemented in software (e.g. the aging analysis tool, in combination with a transistor level simulator, in one embodiment). The software may include instructions which, when executed, implement the described operations.

The aging analysis tool may precharacterize the transistors for different stress conditions (block 70). For example, the transistors may be precharacterized for DC and AC input stimuli, and different amounts of stress such as different amounts of time in the on state (DC simulation) and/or different amounts of switching activity on terminals (AC simulation). The precharacterization may be performed for different transistor types (e.g. transistors designed for different threshold voltages, different oxide thicknesses, etc.) and for different sizes of devices (e.g. different channel widths). The precharacterization may be performed using the transistor level simulator, or may be performed via measurements on actual transistor devices. In other embodiments, characterization data may be provided from the foundry.

Based on the precharacterization, the aging analysis tool may generate data indicating the aging effects and amounts (block 72). For example, tables of data may be generated, storing the type and amount of aging for various stress conditions. Based on the identified aging, aged transistor models may be generated for used in the aging analysis (block 74) and/or parameter modifications to be made to transistors in the netlist may be made.

As mentioned previously, in some embodiments, the aging analysis tool may be able to operate with any of a set of transistor level simulators. Thus, a simulator may be selected for use with a given design based on tradeoffs such as the ability of the simulators to handle the size of the design (e.g. large memory arrays), the speed of the simulator, the accuracy of the simulator, the availability of the simulator (e.g. whether or not all floating licenses at a design house are in use), compatibility of the simulator with the models of the circuit, etc.

Figures 7, 8:
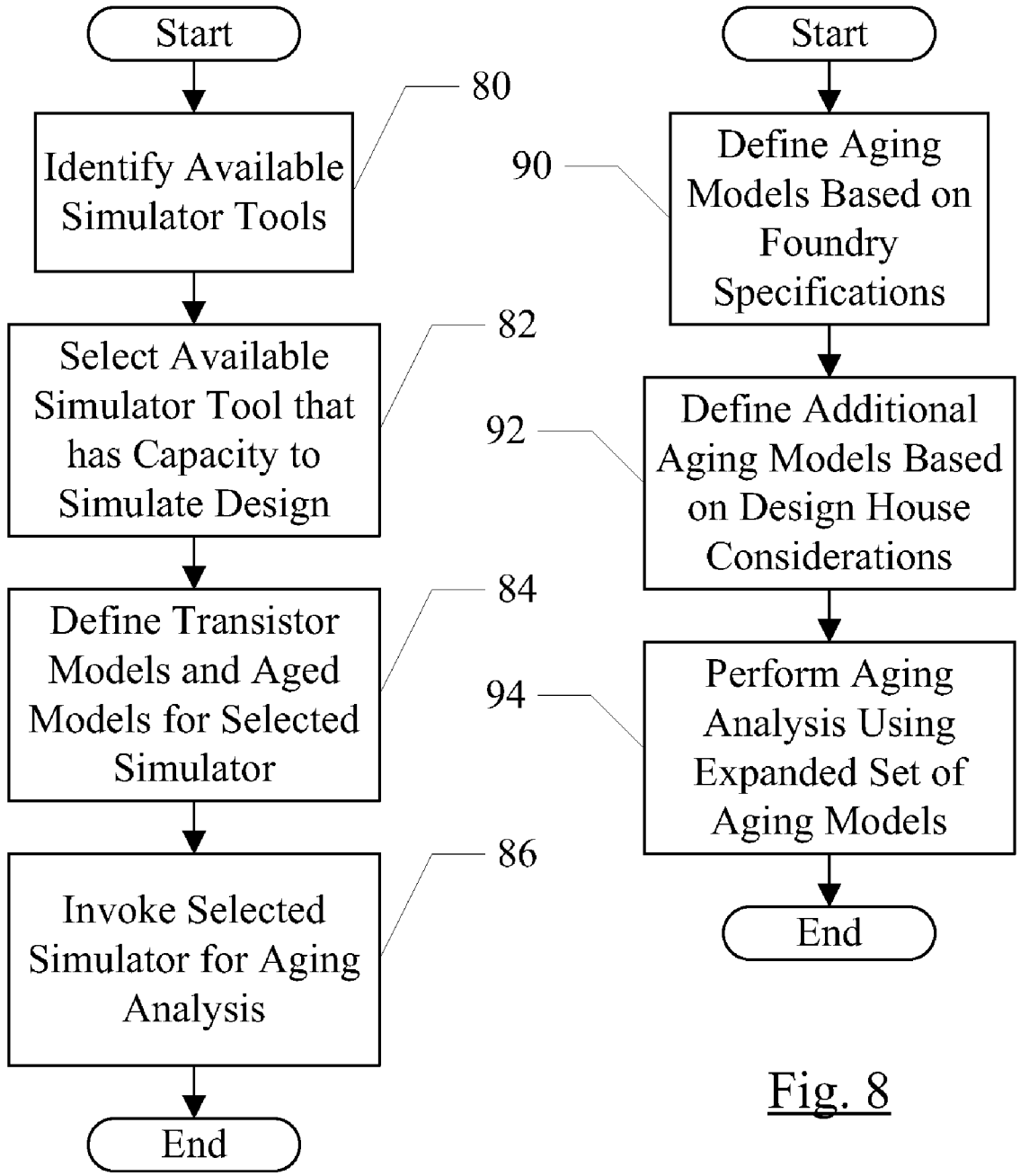
FIG. 7 is a flowchart illustrating one embodiment of a selection of simulator tools.
FIG. 8 is a flowchart illustrating one embodiment of additional transistor model generation.

FIG. 7 is a flowchart illustrating selection of a simulator, for one embodiment. While the blocks are shown in a particular order for ease of understanding, other orders may be used. The set of available simulator tools may be identified (block 80). An available simulator tool that has the capacity to simulate the circuit design (and that meets any other simulator requirements) may be selected (block 82). The transistor models (both nominal and aged) may be defined for the selected simulator (block 84). For example, if the simulator supports Berkley Spice models (BSim models), the BSim models may be used. If the simulator supports Spectre models, the Spectre models may be used. The selected simulator may be invoked as part of the aging analysis (and other analyses, as desired) (block 86).

FIG. 8 is a flowchart illustrating definition of various aging models, for one embodiment. Aging models may be defined based on foundry specifications for the transistors (block 90). Generally, a foundry may be a business or other entity that owns semiconductor manufacturing equipment and manufactures integrated circuits on the equipment. The aging models from the foundry may not always be available to the design house early in the circuit design process. For example, if a new manufacturing process is being implemented (e.g. supporting smaller feature sizes for the transistors), the foundry may wish to characterize the new process prior to making the aged transistor models available. Alternatively or in addition, the design house may be more willing to be aggressive with aging effects (and may be willing to trade off yield for more aggressive circuitry), and thus may wish to use different aging models that do not exhibit as much aging effects as the foundry models show. Additionally, the design house may be considering several foundries or may desire not to be committed to any particular foundry, and thus may wish to investigate aging effects in a more broad spectrum of transistors than just those available with a particular foundry. The design house may thus define additional models based on design house considerations (block 92). For example, the design house may estimate the aging effects. Generally, a design house may be a company or other entity that designs integrated circuits, and that enlists the services of a foundry to manufacture the integrated circuits. The foundry may return the manufactured circuits to the design house for sale, or may sell the integrated circuits on behalf of the design house, on behalf of itself, or both. Various contractual and/or organizational links between the design house and the foundry may exist in various circumstances. Aging analysis may be performed using the expanded set of aging models defined in blocks 90 and 92 (block 94).

Turning now to FIG. 9, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link. The computer accessible storage medium 200 in FIG. 9 may store the aging analysis tool 202. The aging analysis tool 202 may include instructions which, when executed, implement the operation described above with regard to any combination of FIGS. 2 through 8. Generally, the computer accessible storage medium 200 may store any set of instructions which, when executed, implement a portion or all of the operation shown in FIGS. 2 through 8. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:
1. A method comprising:
simulating a first model of a circuit using a first stress vector that specifies a constant input stimulus that places the circuit under aging stress, the simulating performed on one or more computers to produce a first simulation result;
processing the first simulation result to automatically identify one or more first transistors in the circuit that are aged under the first stress vector, the processing performed by the one or more computers;
receiving a list of nets that experience high rates of switching during operation;
identifying one or more second transistors in the circuit that are connected to one or more of the listed nets, the identifying performed by the one or more computers;
modifying a netlist representation of the circuit to replace nominal transistors corresponding to the one or more first transistors and the one or more second transistors with aged transistors that exhibit aging effects, the modifying performed by the one or more computers, wherein nominal transistors remain in the netlist representation subsequent to the modifying for transistors other than the first one or more transistors and the second one or more transistors; and
processing the netlist to ensure that the circuit meets design requirements with the aged transistors in the circuit, the processing performed by the one or more computers.

2. The method as recited in claim 1 wherein the first stress vector specifies worst-case constant input stimuli.

3. The method as recited in claim 1 further comprising a designer of the circuit providing the first stress vector and the list of nets.

4. The method as recited in claim 1 further comprising selecting the aged transistors for insertion into the second model from a set of aged transistors, wherein the selected aged transistor is dependent on an amount of aging expected for each respective first transistor and second transistor.

5. The method as recited in claim 1 further comprising selecting the aged transistors for inclusion in the netlist from a set of aged transistors, wherein the set of aged transistor models includes first aged transistors specified by a foundry that is to manufacture an integrated circuit including the circuit and second aged transistors specified by a design house that designs the circuit.

6. The method as recited in claim 1 wherein processing the netlist comprises generating a second model from the netlist; and simulating the second model in the simulator.

7. A method comprising:
identifying one or more first transistors in a circuit that experience aging effects under input stimuli that do not change during a simulation, the identifying performed by one or more computers;
identifying one or more second transistors in a circuit that experience switching activity-based aging effects, the identifying performed by the one or more computers;
modifying an electronic representation of the circuit to include aged transistors for the one or more first transistors and the one or more second transistors, wherein the aged transistors exhibit aging effects, the modifying perform by the one or more computers, wherein nominal transistors remain in the electronic representation subsequent to the modifying for transistors other than the first one or more transistors and the second one or more transistors, and wherein the electronic representation of the circuit is stored on the one or more computers;
processing the modified representation by the one or more computers; and
analyzing a result of the processing to determine if the circuit meets design requirements with the aged transistors.

8. The method as recited in claim 7 wherein the processing is performed over a range of circuit conditions at which the circuit is expected to operate correctly.

9. The method as recited in claim 7 wherein the aged transistors corresponding to the first transistors have one or more aging characteristics that differ from aging characteristics of the aged transistors corresponding to the second transistors.

10. The method as recited in claim 7 wherein the processing comprises simulating the modified representation, and wherein the simulation comprises selecting a simulator to perform the simulating from one of a plurality of simulators, wherein selecting the simulator includes determining that the simulator is capable of simulating the modified representation, the selecting performed by the one or more computers.

11. The method as recited in claim 10 wherein the simulating comprises invoking the selected simulator.

12. The method as recited in claim 10 further comprising defining a plurality of aged transistor models for the selected simulator.

13. The method as recited in claim 12 wherein the plurality of aged transistor models include one or more aged transistor models specified by a foundry that is to manufacture an integrated circuit including the circuit and one or more additional transistor models specified by a design house that designs the integrated circuit.

14. A non-transitory computer accessible storage medium storing a plurality of instructions which, when executed:
identify one or more first transistors in a circuit that experience aging effects under input stimuli that do not change during a simulation;
identify one or more second transistors in a circuit that experience switching activity-based aging effects;
modify an electronic representation of the circuit to include aged transistors for the one or more first transistors and the one or more second transistors, wherein the aged transistors exhibit aging effects, wherein nominal transistors remain in the electronic representation subsequent to the modification for transistors other than the first one or more transistors and the second one or more transistors, and wherein the electronic representation of the circuit is stored on one or more computers that execute the plurality of instructions during use; and
process the modified representation.

15. The non-transitory computer accessible storage medium as recited in claim 14 wherein the modified representation is processed over a range of circuit conditions at which the circuit is expected to operate correctly.

16. The non-transitory computer accessible storage medium as recited in claim 14 wherein the aged transistors corresponding to the first transistors have one or more aging characteristics that differ from aging characteristics of the aged transistors corresponding to the second transistors.

17. The non-transitory computer accessible storage medium as recited in claim 14 wherein the processing includes simulating the modified representation, and wherein the simulation comprises selecting a simulator to perform the simulating from one of a plurality of simulators, wherein selecting the simulator includes determining that the simulator is capable of simulating the modified representation.

18. The non-transitory computer accessible storage medium as recited in claim 17 wherein the simulating comprises invoking the selected simulator.

19. The non-transitory computer accessible storage medium as recited in claim 17 wherein a plurality of aged transistor models are defined for the selected simulator.

20. The non-transitory computer accessible storage medium as recited in claim 19 wherein the plurality of aged transistor models include one or more aged transistor models specified by a foundry that is to manufacture an integrated circuit including the circuit and one or more additional transistor models specified by a design house that designs the integrated circuit.

* * * * *